(12) United States Patent
Mikhaylich et al.

(10) Patent No.: US 6,711,775 B2
(45) Date of Patent: *Mar. 30, 2004

(54) SYSTEM FOR CLEANING A SEMICONDUCTOR WAFER

(75) Inventors: Katrina A. Mikhaylich, San Jose, CA (US); Mike Ravkin, Sunnyvale, CA (US); Don E. Anderson, Morgan Hill, CA (US)

(73) Assignee: Lam Research Corporation, Fremont, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/329,207

(22) Filed: Jun. 10, 1999

(65) Prior Publication Data

US 2002/0062842 A1 May 30, 2002

(51) Int. Cl.[7] .................................................. B08B 1/04
(52) U.S. Cl. ............................................. 15/77; 15/88.3
(58) Field of Search .......................... 15/21.1, 77, 88.2, 15/88.3, 102; 134/902

(56) References Cited

U.S. PATENT DOCUMENTS

| | | | |
|---|---|---|---|
| 4,062,463 A | 12/1977 | Hillman et al. | 15/77 |
| 4,202,071 A | 5/1980 | Scharpf | 15/302 |
| 4,382,308 A | 5/1983 | Curcio | 15/77 |
| 5,129,955 A | 7/1992 | Tanaka | 134/2 |
| 5,144,711 A * | 9/1992 | Gill, Jr. | 15/77 X |
| 5,317,778 A | 6/1994 | Kudo et al. | 15/88.3 |
| 5,351,360 A * | 10/1994 | Suzuki et al. | 15/77 X |
| 5,357,645 A | 10/1994 | Onodera | 15/97.1 |
| 5,361,449 A | 11/1994 | Akimoto | 15/302 |
| 5,486,134 A | 1/1996 | Jones et al. | 451/209 |
| 5,490,809 A | 2/1996 | Jones et al. | 451/60 |
| 5,581,837 A | 12/1996 | Uchiyama et al. | 15/77 |
| 5,624,501 A | 4/1997 | Gill, Jr. | 134/6 |
| 5,639,311 A | 6/1997 | Holly et al. | 134/6 |
| 5,651,160 A | 7/1997 | Yonemizu et al. | 15/302 |
| 5,675,856 A | 10/1997 | Itzkowitz | 15/77 |
| 5,693,148 A | 12/1997 | Simmons et al. | 134/18 |
| 5,709,755 A | 1/1998 | Kuo et al. | 134/1.3 |
| 5,778,554 A | 7/1998 | Jones | 34/58 |
| 5,806,126 A | 9/1998 | de Larios et al. | 15/102 |
| 5,875,507 A | 3/1999 | Stephens et al. | 15/102 |
| 6,041,465 A * | 3/2000 | Yashiki et al. | 15/88.3 |

FOREIGN PATENT DOCUMENTS

| | | | | |
|---|---|---|---|---|
| FR | 2722511 | | 1/1996 | |
| JP | 60-143634 | * | 4/1985 | 15/77 |
| JP | 63-4617 | | 1/1988 | |
| JP | 4-94537 | * | 3/1992 | 134/902 |
| JP | 5-3184 | * | 1/1993 | 134/902 |
| JP | 6-120192 | * | 4/1994 | 134/902 |
| WO | WO 97/13590 | | 4/1997 | |
| WO | WO 99/22908 | | 5/1999 | |

* cited by examiner

Primary Examiner—Mark Spisich
(74) Attorney, Agent, or Firm—Martine & Penilla, LLP

(57) ABSTRACT

A method and a system are provided for cleaning a surface of a wafer. The method starts by scrubbing the surface of the wafer with a cleaning brush that applies a chemical solution to the surface of the wafer. In one example, the cleaning brush implements a through the brush (TTB) technique to apply the chemicals. The scrubbing is generally performed in a brush box, with a top cleaning brush and a bottom cleaning brush. The top cleaning brush is then removed from contact with the surface of the wafer. The chemical concentration in the top brush may be maintained at substantially the same concentration that was in the brush during the scrubbing operation. Next, a flow of water (preferably de-ionized water) is delivered to the surface of the wafer. The delivery of water is preferably configured to remove substantially all of the chemical solution from the surface of the wafer before proceeding to a next cleaning operation.

12 Claims, 9 Drawing Sheets

SYSTEM FOR CLEANING A SEMICONDUCTOR WAFER

BACKGROUND OF THE INVENTION

1. Field of the Invention

The present invention relates to semiconductor wafer cleaning and, more particularly, to techniques for more efficiently applying cleaning fluids over a wafer and improving wafer cleaning throughput.

2. Description of the Related Art

In the semiconductor chip fabrication process, it is well-known that there is a need to clean a wafer where a fabrication operation has been performed that leaves unwanted residuals on the surface of the wafer. Examples of such a fabrication operation include plasma etching (e.g., tungsten etch back (WEB)) and chemical mechanical polishing (CMP). If left on the surface of the wafer for subsequent fabrication operations, the unwanted residual material and particles may cause, among other things, defects such as scratches on the wafer surface and inappropriate interactions between metallization features. In some cases, such defects may cause devices on the wafer to become inoperable. In order to avoid the undue costs of discarding wafers having inoperable devices, it is therefore necessary to clean the wafer adequately yet efficiently after fabrication operations that leave unwanted residue on the surface of the wafer.

FIG. 1A shows a high level schematic diagram of a wafer cleaning system 50. The cleaning system 50 typically includes a load station 10 where a plurality of wafers in a cassette 14 may be inserted for cleaning through the system. Once the wafers are inserted into the load station 10, a wafer 12 may be taken from the cassette 14 and moved into a brush box one 16a, where the wafer 12 is scrubbed with selected chemicals and water (e.g., de-ionized (DI) water). The wafer 12 is then moved to a brush box two 16b. After the wafer has been scrubbed in the brush boxes 16, the wafer is moved into a spin, rinse, and dry (SRD) station 20 where DI water is sprayed onto the surface of the wafer and spun to dry. During the rinsing operation in the SRD station, the wafer rotates at about 100 rotations per minute or more. After the wafer has been placed through the SRD station 20, the wafer is moved to an unload station 22.

FIG. 1B shows a simplified view of a cleaning process performed in brush box one 16a. In brush box one 16a, the wafer 12 is inserted between a top brush 30a and a bottom brush 30b. The wafer 12 is capable of being rotated to enable the rotating brushes 30a and 30b to adequately clean the entire top and bottom surfaces of the wafer. In certain circumstances, the bottom surface of the wafer is required to be cleaned as well because contaminants from the bottom may migrate to the top surface 12a. Although both the top surface 12a and the bottom surface of the wafer are scrubbed with the brushes 30, the top surface 12a that is scrubbed with the top brush 30a is the primary surface targeted for cleaning, since the top surface 12a is where the integrated circuit devices are being fabricated.

After typical CMP operations, a wafer is placed into the cleaning station 50. In brush box one 16a, the top brush 30a and the bottom brush 30b are preferably concentrated with a cleaning chemical, which is received from a source 32. Once scrubbing is performed with the chemicals, it is generally desired to have the wafer surface 12a cleaned with water. The water cleaning is carried out such that substantially all of the chemicals used during the scrubbing are removed from the surface of the wafer 12a. In the prior art, the standard process is to pass the water through the brush (TTB).

However, because the chemical scrubbing was just completed, the brushes will be highly saturated with the cleaning chemicals. Consequently, in order to properly clean the surfaces of the wafer with water, the brushes are typically flushed with large amounts of water in an effort to remove the chemicals from the brushes and from over the wafer surfaces. Unfortunately, although the brushes are flushed with a large amount of water, a lower concentration of the cleaning chemicals remains in the brushes themselves and on the wafer surfaces. Accordingly, such a cleaning process is noticeably flawed because some chemicals used in the cleaning operation itself may remain on the wafer when the wafer is moved to the next brush box.

In some cases, the remaining chemicals can have the disadvantageous effect of causing unwanted reactions with the cleaning chemicals applied in the next brush box, and in other cases, some cleaning chemicals may remain on the wafer surface when the wafer is moved to the SRD station 20. Unwanted reactions can also have the downside of generating or introducing particulates. Furthermore, if hydrofluoric (HF) acid is used in the cleaning system 50, it is very important that substantially all of the HF be removed before the wafer is introduced to the SRD station 20. In situations where some HF remains on the wafer surfaces, the HF can have the destructive effect of eating away at the interior mechanical parts of the SRD station 20.

Assuming that the scrubbing is complete for a given wafer in brush box one 16a, and that the wafer is moved to a next station, another wafer will be introduced into brush box one 16a from the load station 10. Before the new wafer can be cleaned with the cleaning chemicals, a time must pass while the brushes 30 are brought up to the appropriate chemical concentration. This replenishing of the chemicals is necessary because during the cleaning of the prior wafer the brushes were flushed with water to remove the chemicals and perform the DI water cleaning. After some time passes, the brushes will once again be ready to be applied to the wafer so that the chemical cleaning can be performed with the brushes.

It should be apparent that the aforementioned cleaning technique is unduly inefficient. Such a cleaning process has the downside of taking more time to load the brushes with chemicals to the desired chemical concentration, flush the chemicals from the brushes to perform the water cleaning, and then re-loading the brushes with chemicals again. Not only is the process inefficient, this process can be unsafe, in that unwanted chemical reactions can occur, particulate generation can be promoted, and the mechanical components of the cleaning station 50 can thereby be placed at risk of degradation.

In view of the foregoing, there is a need for a cleaning process that avoids the problems of the prior art by improving cleaning fluid application techniques and increasing wafer cleaning throughput.

SUMMARY OF THE INVENTION

Broadly speaking, the present invention fills these needs by providing an improved method for cleaning a semiconductor wafer. The method implements a technique for maintaining the chemical concentration in the brushes at a substantially constant level throughout the wafer cleaning process. It should be appreciated that the present invention can be implemented in numerous ways, including as a process, an apparatus, a system, a device or a method. Several inventive embodiments of the present invention are described below.

In one embodiment, a method is disclosed for cleaning a surface of a wafer. The surface of the wafer is generally scrubbed with a cleaning brush that applies a chemical solution to the surface of the wafer. In this embodiment, the cleaning brush implements a through the brush (TTB) technique to apply the chemicals. The scrubbing is generally performed in a brush box, with a top cleaning brush and a bottom cleaning brush. The top cleaning brush may then be removed from contact with the top surface of the wafer. The flow of chemicals through the top brush is preferably stopped, and the chemical concentration in the top brush is preferably maintained at substantially the same concentration that was in the brush during the scrubbing operation. Next, a flow of water (preferably de-ionized water) is delivered to the surface of the wafer. The delivery of water is preferably configured to substantially remove the chemical solution from the surface of the wafer before proceeding to a next cleaning operation.

In another embodiment, a system for cleaning a semiconductor wafer is disclosed. The system includes a brush box, which has a top brush and a bottom brush for scrubbing the top surface and the bottom surface of the wafer, respectively. The brushes are configured to implement a chemical cleaning solution for the scrubbing operation. The top brush is configured to be raised from the top surface, as the wafer sits over the bottom brush and rotates against rollers. The system also contains at least one top nozzle for applying a flow of water (preferably de-ionized water) over the top surface of the wafer. The flow of water that is applied by the top nozzles is configured to remove substantially all of the chemical cleaning solution. The system may also contain at least one bottom nozzle for applying the flow of water to the bottom surface of the semiconductor wafer.

In yet another embodiment, an apparatus for cleaning a semiconductor wafer is disclosed. The apparatus contains a brush box, which includes a top brush and a bottom brush for scrubbing a top surface and a bottom surface of the wafer, respectively. The brushes may be configured to implement a chemical cleaning solution for the scrubbing operation. The wafer is configured to be held and to rotate by a set of rollers, without contacting the top and bottom brushes. The apparatus also contains at least one top nozzle for applying a flow of water over the top surface of the semiconductor wafer. The flow of water applied by the top nozzles is configured to remove substantially all of the chemical cleaning solution. The system may also contain at least one bottom nozzle for applying the flow of water to the bottom surface of the semiconductor wafer.

Advantageously, by implementing a method for maintaining the concentration in the cleaning brushes at a substantially constant level, the efficiency of the wafer cleaning process is substantially improved. The cleaning process of the present invention eliminates the time required to flush the chemicals from the brushes for the water cleaning. Also, chemicals do not have to be re-loaded into the brushes in order to prepare for the next wafer, thereby substantially reducing the waste of expensive chemicals. In addition to efficiency, the method also improves safety because it substantially eliminates unwanted chemical reactions and inhibits particulate formation. As a result, the mechanical components of the cleaning station are placed at a substantially lower risk of degradation.

Other aspects and advantages of the present invention will become apparent from the following detailed description, taken in conjunction with the accompanying drawings, illustrating by way of example the principles of the present invention.

BRIEF DESCRIPTION OF THE DRAWINGS

The present invention will be readily understood by the following detailed description in conjunction with the accompanying drawings. To facilitate this description, like reference numerals designate like structural elements.

FIG. 3A-2 shows a side view of the cleaning apparatus of FIG. 3A-1, in accordance with one embodiment of the present invention.

FIG. 3B-1 shows a top view of a process of applying water to the wafer surfaces by way of a nozzle system, in accordance with one embodiment of the present invention.

FIG. 3B-2 shows a side view of the process of FIG. 3B-1, in accordance with one embodiment of the present invention.

FIG. 3B-3 shows a top view of a process of applying water to the wafer surface by way of a nozzle system, the wafer being rotated by rollers, in accordance with one embodiment of the present invention.

FIG. 3B-4 shows a side view of the process of FIG. 3B-3, in accordance with one embodiment of the present invention.

FIG. 4 shows an enlarged view of a nozzle fixedly positioned over a wafer, in accordance with one embodiment of the present invention.

DETAILED DESCRIPTION OF THE PREFERRED EMBODIMENTS

An invention for methods and systems for cleaning a surface of a semiconductor wafer are disclosed. In the following description, numerous specific details are set forth in order to provide a thorough understanding of the present invention. It will be understood, however, by one of ordinary skill in the art, that the present invention may be practiced without some or all of these specific details. In other instances, well known process operations have not been described in detail in order not to unnecessarily obscure the present invention.

Figure 1A:
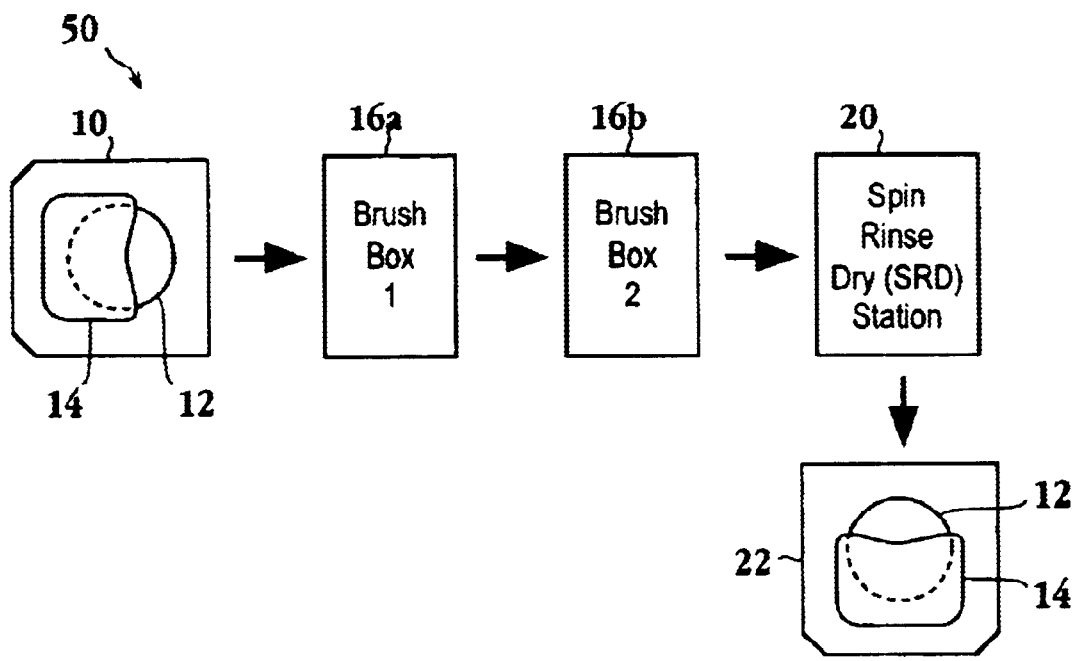
FIG. 1A shows a high level schematic diagram of a wafer cleaning system.
Figure 1B:
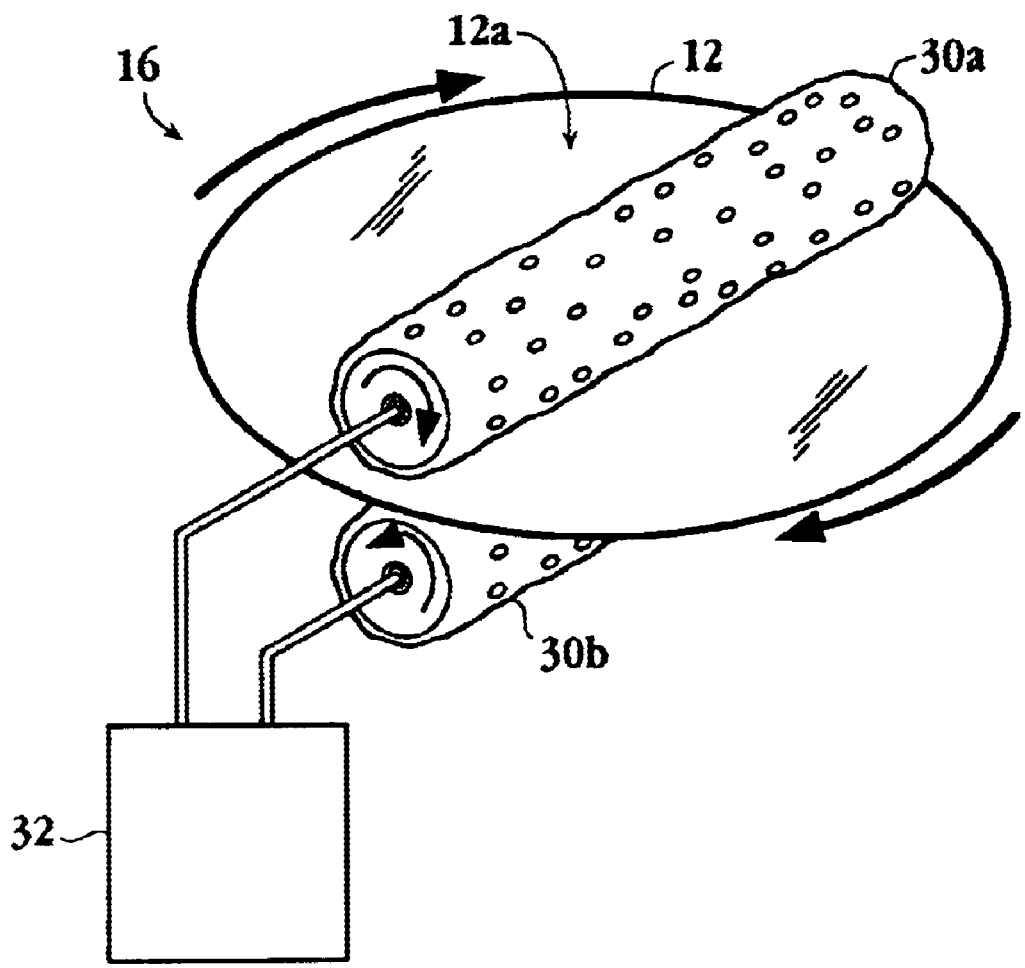
FIG. 1B shows a detailed view of a wafer cleaning process performed in a brush box.
Figure 2A:
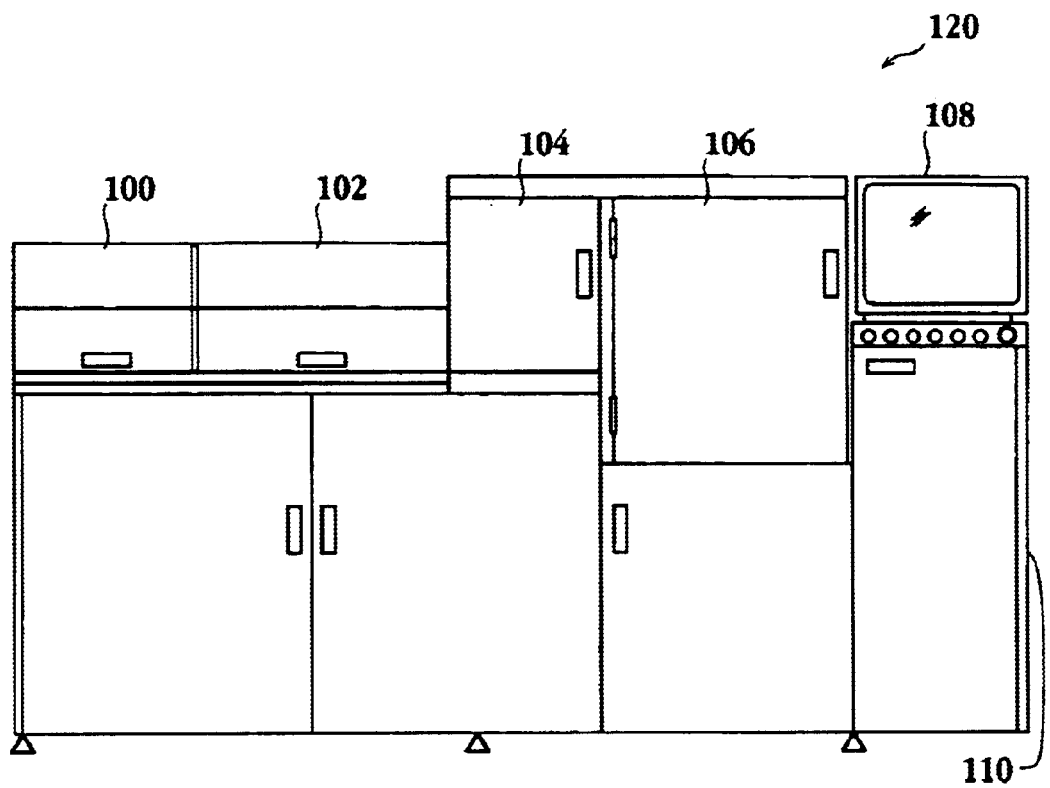
FIG. 2A shows a side view of a wafer cleaning system, in accordance with one embodiment of the present invention.
Figure 2B:
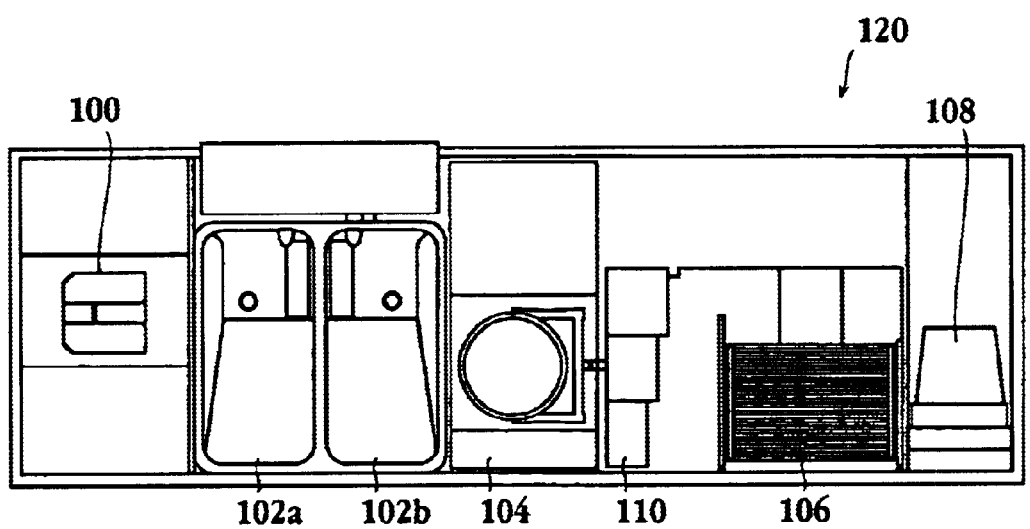
FIG. 2B shows a top view of the cleaning system of FIG. 2A, in accordance with one embodiment of the present invention.

FIGS. 2A and 2B show a side view and a top view, respectively, of a cleaning system 120. The cleaning system 120 typically includes an input station 100 where a plurality of wafers may be inserted for cleaning through the system. Once the wafers are inserted into the input station 100, a wafer may be taken from the input station 100 and moved into a brush box one 102a, where the wafer is scrubbed with selected chemicals and water (e.g., de-ionized water) before being moved to a brush box two 102b.

After the wafer has been scrubbed in the brush boxes 102, the wafer is moved into a spin, rinse, and dry (SRD) station 104, where de-ionized (DI) water is sprayed onto the surface of the wafer and spun to dry. After the wafer has been placed through the SRD station 104, an unload handler 110 takes the wafer and moves it into an output station 106. The cleaning system 120 is configured to be programmed and controlled from system electronics 108.

Figures 1, 3A:
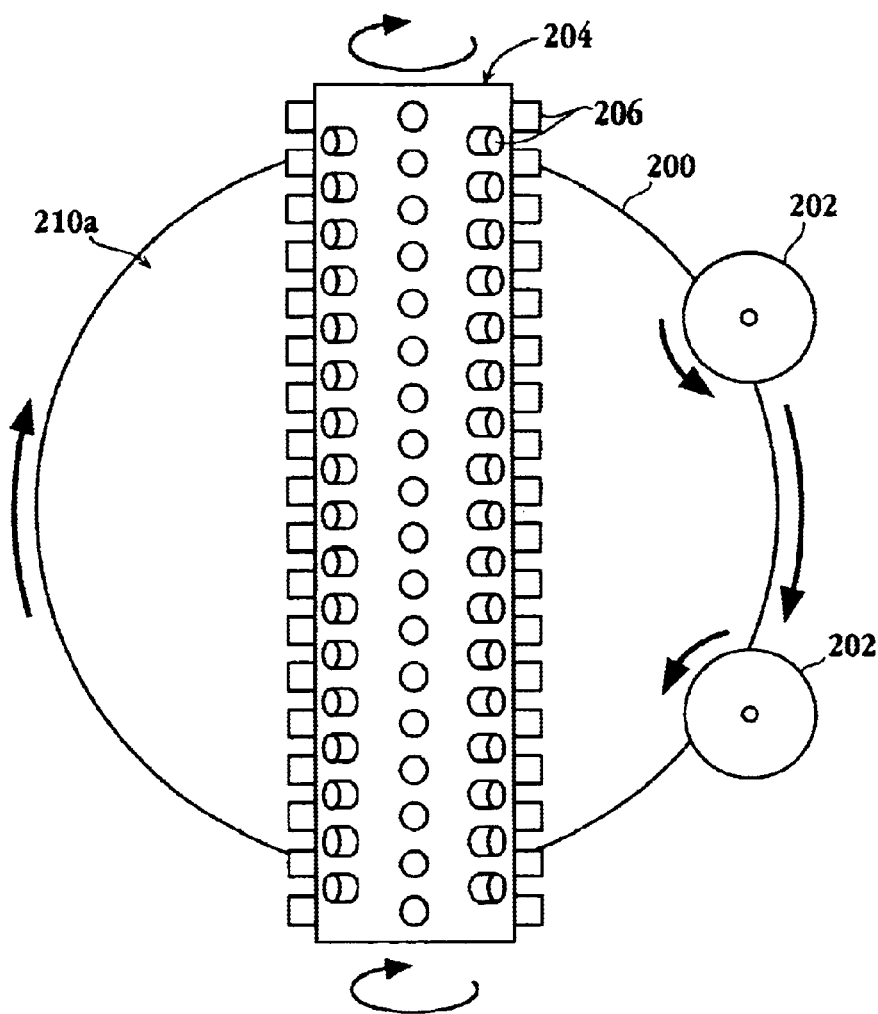
FIG. 3A-1 shows a top view of a wafer cleaning apparatus inside a brush box, in accordance with one embodiment of the present invention.
Figures 2, 3A:
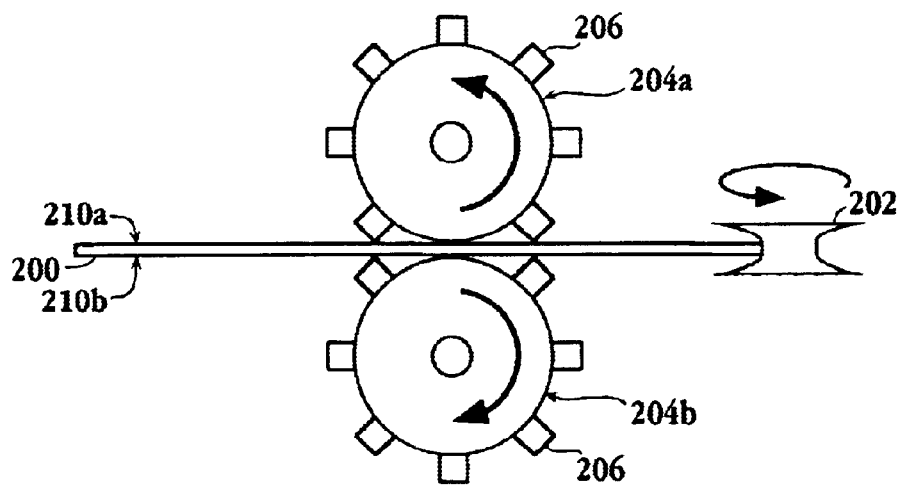

FIGS. 3A-1 and 3A-2 show a detailed view of a cleaning apparatus inside one of the brush boxes 102. A load handler may take the wafer 200 from the input station 100 and position the wafer inside the brush box 102a. A top cleaning brush 204a and a bottom cleaning brush 204b, may be positioned on the respective top wafer surface 210a and bottom wafer surface 210b, as shown in FIG. 3A-2. A cleaning brush 204 typically has a plurality of small surface mounds 206 distributed in evenly spaced rows along the surface of the cleaning brush 204. The brushes 204 are also referred to as polyvinyl alcohol (PVA) brushes, and are very soft and porous. Therefore, the brushes 204 are capable of scrubbing a wafer clean without damaging the delicate surface. Because the brushes 204 are porous, they are able to function as a conduit for fluids that are to be applied to the wafer surface 210.

For more information on wafer cleaning systems and techniques, reference may be made to commonly owned U.S. patent application Nos.: (1) 08/792,093, filed Jan. 31, 1997, U.S. Pat. No. 5,858,109, entitled "Method And Apparatus For Cleaning Of Semiconductor Substrates Using Standard Clean 1 (SC1)," and (2) 08/542,531, filed Oct. 13, 1995, abandoned, entitled "Method and Apparatus for Chemical Delivery Through the Brush." Both U.S. patent applications are hereby incorporated by reference.

During the cleaning process, the wafer 200 may be rotated between the cleaning brushes 204 and a set of rollers 202. The wafer preferably rotates at about 20 rotations per minute or less. It should be appreciated that this is about ⅕ the rotational speed using in conventional SRD stations. Although FIG. 3A-1 illustrates two rollers 202, it should be appreciated by one of ordinary skill in the art that additional or fewer rollers 202 can be used, preferably as long as the wafer is properly balanced between the cleaning brushes 204. As shown in FIG. 3A-2, in a typical cleaning process, the cleaning brushes 204 rotate about their radial axes and scrub the wafer surfaces 210 as the wafer rotates between the cleaning brushes 204. The surface mounds 206 assist in achieving improved scrubbing of the wafer surfaces 210.

A chemical cleaning fluid is generally applied to the wafer surfaces 210 through the brush (TTB) as the cleaning brushes 204 scrub the wafer surfaces 210. It should be appreciated by one of ordinary skill in the art that a chemical cleaning fluid may alternatively be applied by other means, such as an external drip applicator (not shown), as opposed to TTB.

Where a chemical cleaning fluid has been applied to the wafer surfaces 210 via a TTB application technique, it is generally desired to clean the wafer surfaces 210 with water (preferably de-ionized water) in order to remove the chemicals from the wafer surface 210. If left on the wafer surface 210, the chemicals may cause unwanted reactions in subsequent cleaning and post-cleaning operations.

As mentioned above, using a TTB technique to apply water to the wafer surfaces 210 is extremely inefficient. Time is wasted on loading the brushes with chemicals to the desired chemical concentration, flushing the chemicals from the brushes to perform the water cleaning, and then re-loading the brushes with chemicals again. Moreover, not only is the process inefficient, this process can be unsafe. Unwanted chemical reactions can occur, particulate generation can be promoted, and the mechanical components of the cleaning system (particularly components of the SRD station) can be placed at an increased risk of degradation. The following discussion discloses techniques for substantially eliminating the aforementioned need to flush the brushes 204 with water and thereby change the chemical concentration in the brushes 204.

Figures 1, 3B:
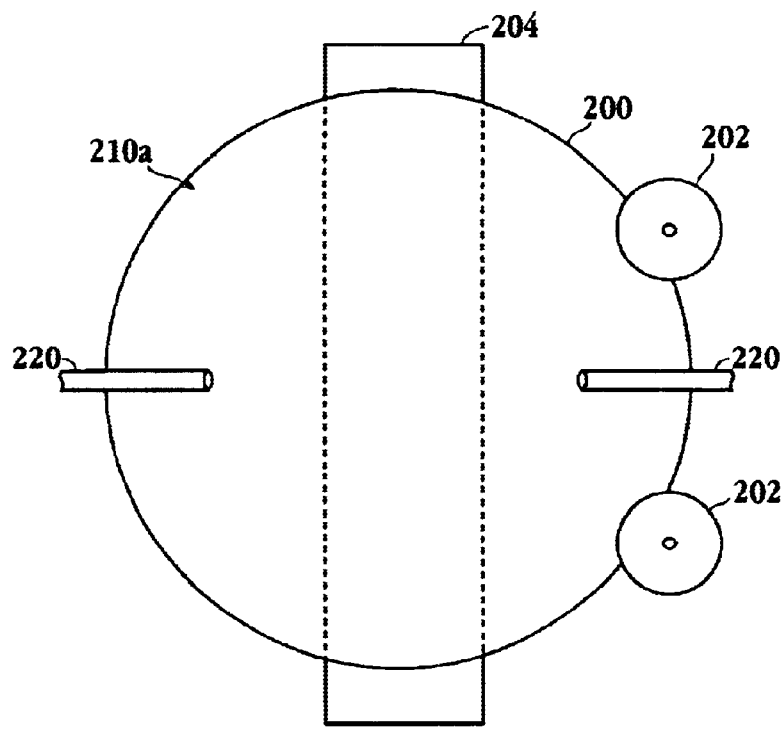
Figures 2, 3B:
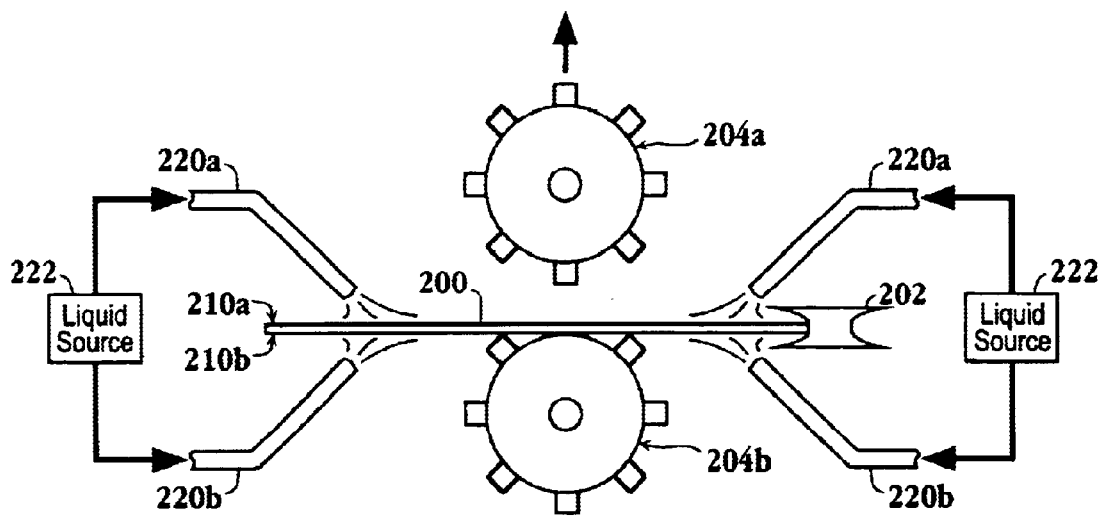

FIGS. 3B-1 and 3B-2 show a process of applying water to the wafer surfaces 210 by way of nozzles 220, in accordance with one embodiment of the present invention. The top cleaning brush 204a may be raised away from the top wafer surface 210a, as depicted in FIG. 3B-2. As mentioned above, the wafer 200 may be held by the bottom cleaning brush 204b and a set of rollers 202. Although FIG. 3B-2 illustrates two rollers 202, it should be appreciated that additional or fewer rollers 202 can be used, preferably as long as the wafer is properly held on the bottom cleaning brush 204b. In this embodiment, a liquid source 222 is used to supply liquid through a conduit that leads to the nozzles 220. The nozzles 220 may be configured to evenly and quickly distribute water over the wafer surfaces 210 as the wafer 200 rotates and is balanced on the bottom cleaning brush 204b and the two rollers 202.

In a preferred embodiment, two top nozzles 220a may be used for applying water to the top surface 210a, while two bottom nozzles 220b may be used for applying water to the bottom surface 210b. Such an embodiment includes a total of four nozzles 220, as shown in FIG. 3B-2. In an alternative embodiment (not shown), two nozzles may be used for applying water to the top surface, while one nozzle may be used for applying water to the bottom surface. In other embodiments of the present invention, additional or fewer nozzles 220 may be used, preferably as long as the nozzles 220 are positioned in such a way as to distribute water evenly over at least the top surface 210a of wafer 200.

The flow rate of the water out of any one of the nozzles 220 is preferably between about 150 ml/minute and about 750 ml/minute, more preferably between about 300 ml/minute and about 600 ml/minute, and most preferably about 500 ml/minute. The water pressure of any one of the nozzles 220 is preferably between about 20 psi and about 50 psi, more preferably between about 25 psi and about 45 psi, and most preferably about 35 psi. The duration for rinsing the wafer surfaces 210 is preferably selected to be between about 5 seconds and about 60 seconds, more preferably between about 10 seconds and about 45 seconds, and most preferably about 15 seconds.

In cases where hydrofluoric (HF) acid is used in the cleaning, it is generally desired that the pH of the fluids that remain over the wafer surfaces 210 be at least about 4 or greater after the rinsing with the water (pH value of 4 corresponds to HF concentration of about 2.3 ppm (parts per million)). Note that water has a pH of about 7. In an alternative embodiment, where base cleaning is performed, it is generally desired that the pH of the fluids that remain over the wafer surfaces 210 be at most about 8.5 or less after the rinsing with the water that has a pH of about 7.

In typical cases where acid cleaning is performed, the cleaning pH level is typically set to about 2 (pH value of 2 corresponds to HF concentration of about 3500 ppm). Thus, the desire to bring up the pH level in acid chemicals is primarily due to the fact that acids having pH levels less than about 4 can cause unwanted reactions in subsequent cleaning operations or cause the cleaning station equipment to degrade. The rapid rinsing with the nozzles 220 therefore enables quick removal of most of the cleaning chemicals and also assists in efficiently increasing the pH of any remaining surface chemicals. Bringing up the pH level also adds additional safety to the SRD station, which is easily accessible to operators of an SRD station. For operators handling HF, the permissible exposure limit (PEL) for HF is about 3 ppm.

Figures 3, 3B:
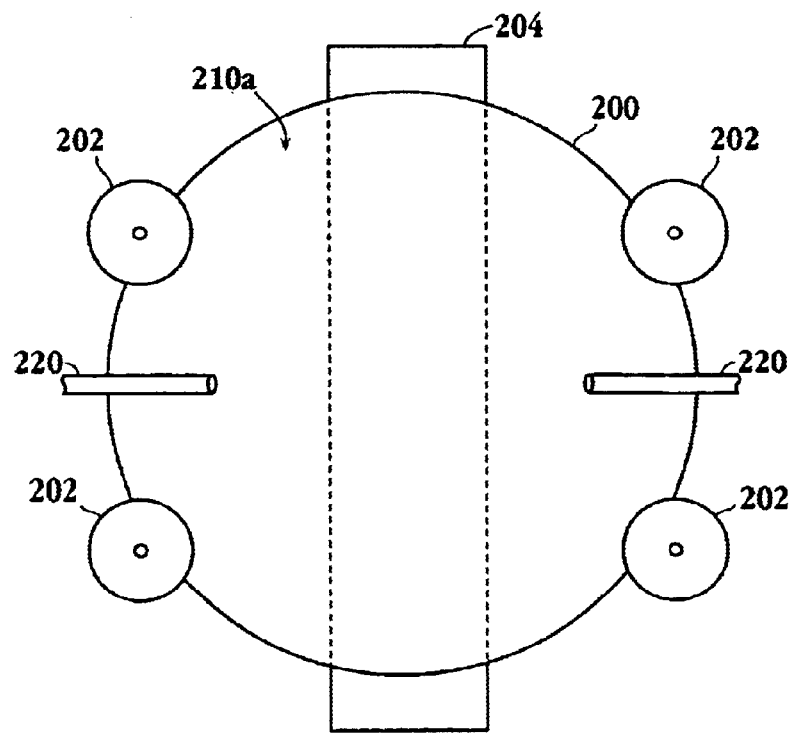
Figures 3, 3B, 4:
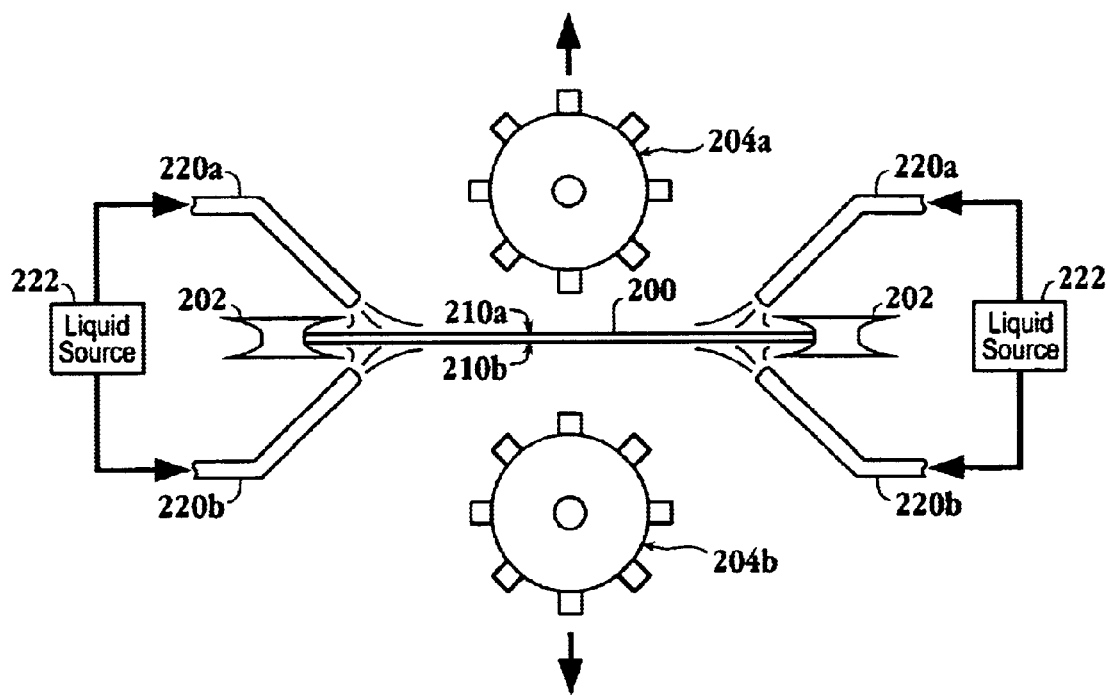
Figure 4:
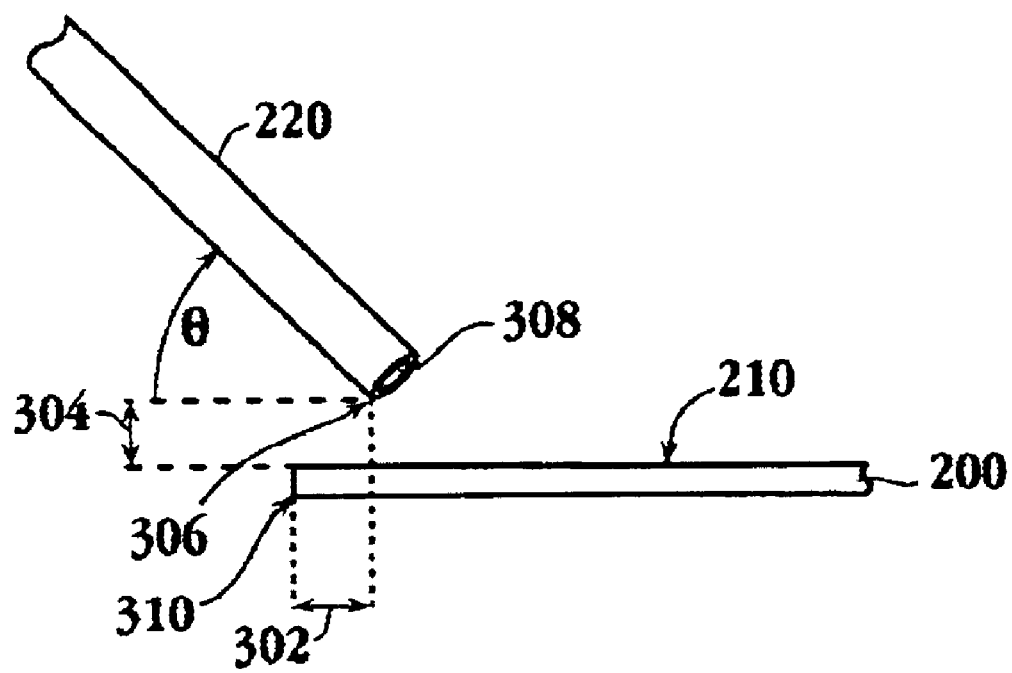

FIGS. 3B-3 and 3B-4 show a process of applying water to the wafer surfaces 210 by way of nozzles 220, the wafer being rotated by four rollers 202, in accordance with one embodiment of the present invention. The top cleaning brush 204a may be raised away from the top wafer surface 210a, as depicted in FIG. 3B-4. Likewise, the bottom cleaning brush 204b may be removed from the bottom wafer surface 210b. The wafer 200 may be held by a set of rollers 202. Although FIG. 3B-3 illustrates four rollers 202, it should be appreciated that additional or fewer rollers 202 can be used, preferably as long as the wafer is properly held between the rollers 202. In this embodiment, a liquid source 222 is used to supply liquid through a conduit that leads to the nozzles 220. The nozzles may be configured to evenly and quickly distribute water over the wafer surfaces 210 as the wafer rotates and is held on the four rollers 202.

In a preferred embodiment, two top nozzles 220a may be used for applying water to the top surface 210a, while two bottom nozzles 220b may be used for applying water to the bottom surface 210b. Such an embodiment includes a total of four nozzles 220, as shown in FIG. 3B-2. In an alternative embodiment (not shown), two nozzles may be used for applying water to the top surface, while one nozzle may be used for applying water to the bottom surface. In other embodiments of the present invention, additional or fewer nozzles 220 may be used, preferably as long as the nozzles 220 are positioned in such a way as to distribute water evenly over at least the top surface 210a of wafer 200.

FIG. 4 shows an enlarged view of one of the nozzles 220 fixedly positioned over the wafer 200, in accordance with one embodiment of the present invention. Although FIG. 4 shows a view of one of the top nozzles 220a, it should be apparent that the following discussion is applicable to any one of the bottom nozzles 220b as well.

In a preferred embodiment, the position of the nozzle 220 relative to the wafer 200 may be defined by three parameters. First, the nozzle 220 may be positioned relative to the wafer surface 210 such that the plane of the wafer surface 210 and the radial axis of the nozzle 220 form an angle θ. Second, the nozzle 220 may be positioned such that outer side 306 of the nozzle opening 308 is inward from the wafer edge 310 a predetermined edge distance 302. Third, the nozzle 220 may be positioned such that the outer side 306 of the nozzle opening 308 is above the wafer surface 210 a predetermined raised distance 304.

The angle θ is preferably between about 10 degrees and about 35 degrees, more preferably between about 15 degrees and about 25 degrees, and most preferably about 20 degrees. The edge distance 302 is preferably between about 3 mm and about 20 mm, and most preferably about 5 mm. The raised distance 304 is preferably about 5 mm. The raised distance 304 can vary between about 2 mm and about 15 mm.

Figure 5:
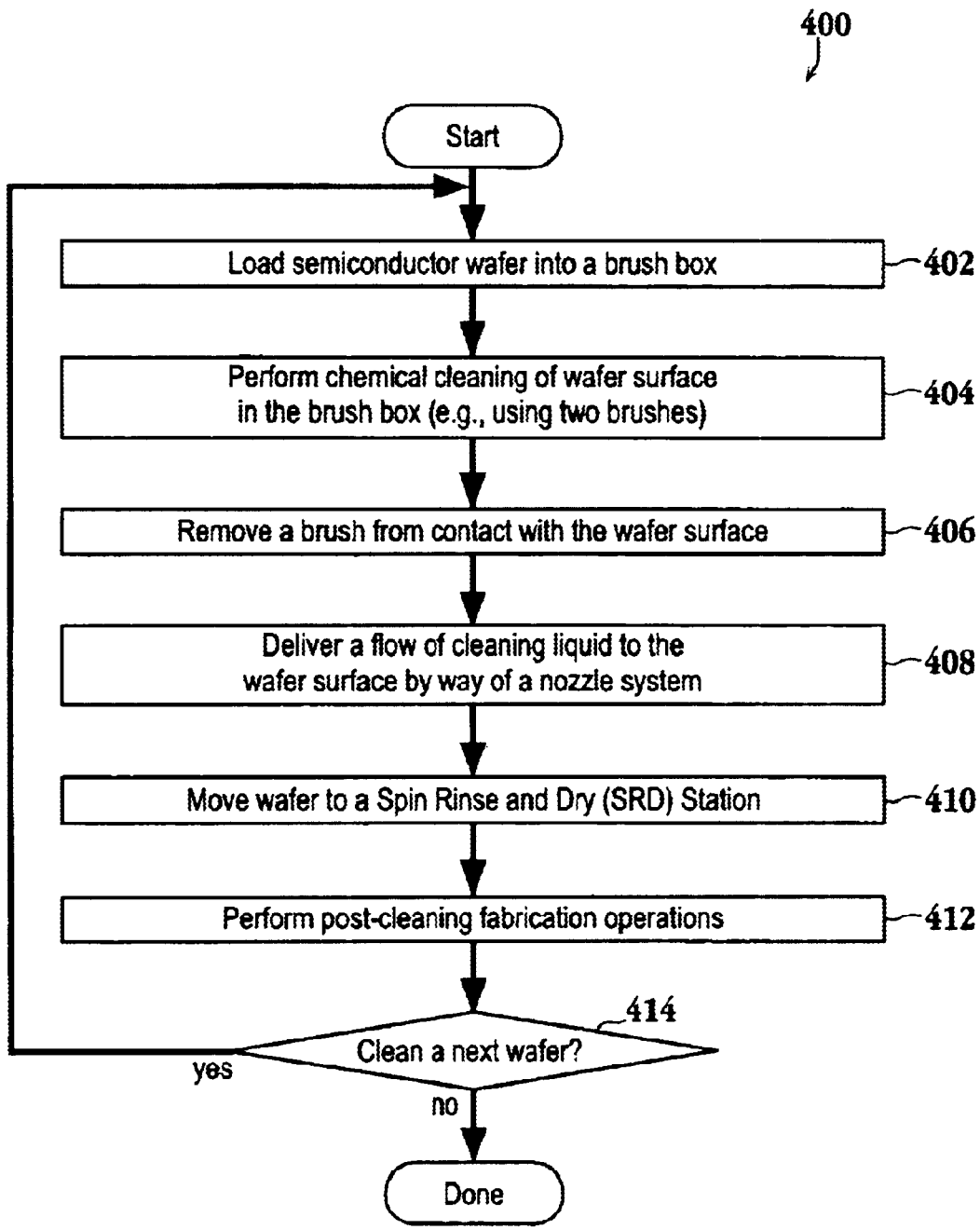
FIG. 5 shows a flow chart for a wafer cleaning process, in accordance with one embodiment of the present invention.

FIG. 5 shows a flow chart for a wafer cleaning process 400, according to one embodiment of the present invention.

The process 400 starts in operation 402, where a semiconductor wafer 200 may be loaded into a brush box 102. The process 400 then moves to operation 404, where a chemical cleaning may be performed on the wafer surface 210 in the brush box 102. This chemical cleaning is preferably performed with two brushes 204, as discussed above with reference to FIGS. 3A-1 and 3A-2. Next, the process 400 will move to operation 406, where a brush (preferably the top brush 204a) is removed from contact with the wafer surface 210. The wafer 200 is preferably held between the bottom cleaning brush 204b and a set of rollers 202 as the wafer 200 rotates, as discussed above with reference to FIGS. 3B-1 and 3B-2. After operation 406, the process 400 moves to operation 408, where a flow of cleaning fluid is delivered to the wafer surface 210 by way of a nozzle system. This cleaning fluid is preferably de-ionized water which is configured to rinse-off unwanted chemicals and particulates from the wafer surface 210 after the chemical cleaning. As mentioned above, the application of this cleaning fluid after the chemical cleaning avoids the need to clean the wafer 200 using a time consuming and less thorough TTB process.

After operation 408, the process 400 moves to operation 410, where the wafer 200 is moved to a spin, rinse and dry (SRD) station 104. Instead of moving to operation 410, the process 400 may alternatively transport the wafer 200 to a second brush box 102b, and any combination of operations 404, 406 and 408 may be performed in the second brush box 102b as well. After operation 410 or after the second brush box 102b, the process 400 will proceed to operation 412, where fabrication operations following the foregoing cleaning operations may be performed on the wafer 200.

The process 400 then proceeds to a decision operation 414, where it is determined whether a next wafer is to be cleaned. If there is no next wafer to be cleaned, the process 400 is done. On the other hand, if a next wafer is desired to be cleaned, the process 400 will go back to operation 402 where another semiconductor wafer is loaded into the brush box 102. The foregoing cycle continues preferably until there is no next wafer at decision operation 414.

Figure 6:
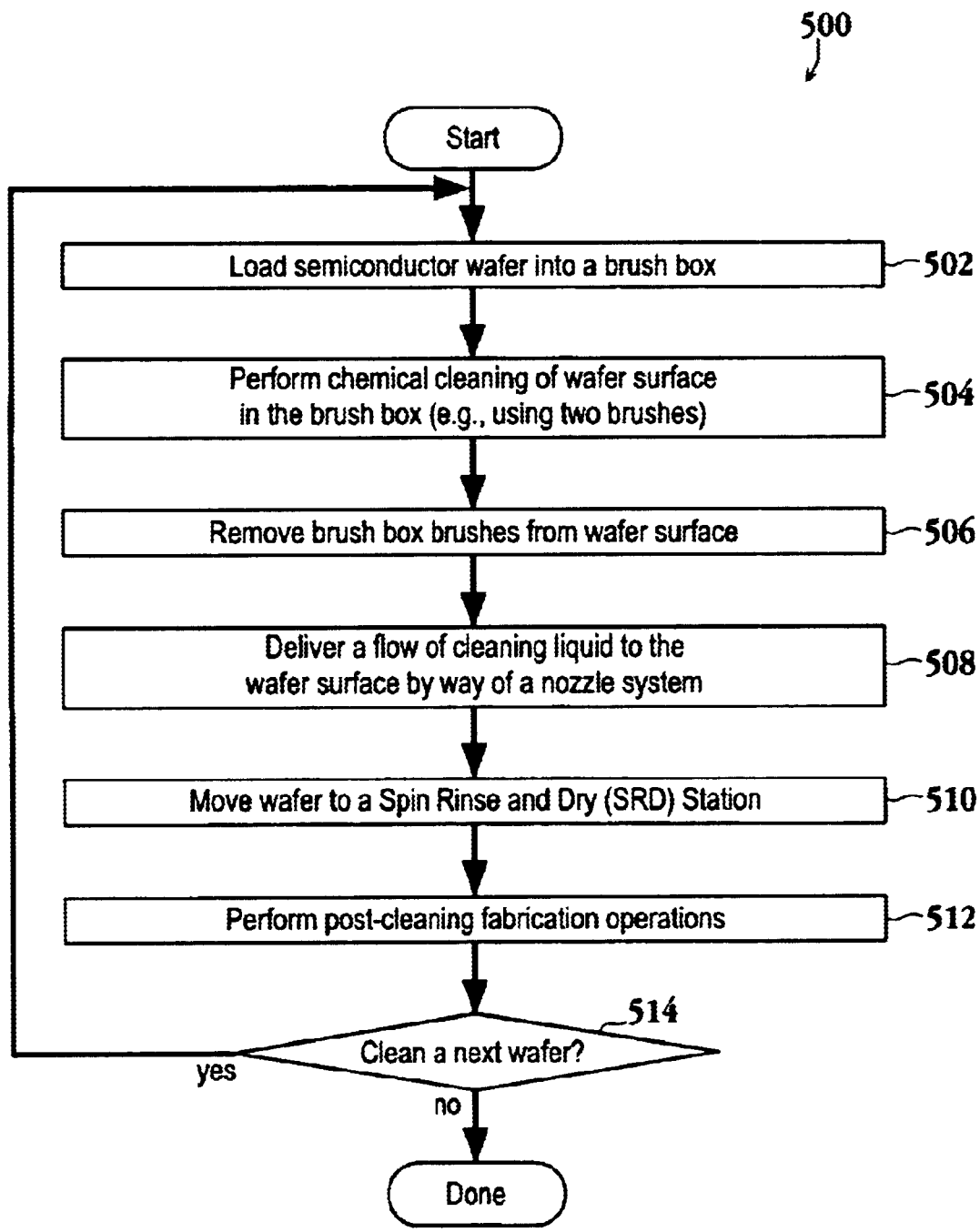
FIG. 6 shows a flow chart for an alternative wafer cleaning process, in accordance with one embodiment of the present invention.

FIG. 6 shows a flow chart for an alternative wafer cleaning process 500, according to one embodiment of the present invention. The process 500 starts in operation 502, where a semiconductor wafer 200 is loaded into a brush box. The process 500 then moves to operation 504, where a chemical cleaning is performed on the wafer surface 210 in the brush box 102. This chemical cleaning is preferably performed with two brushes 204, as discussed above with reference to FIGS. 3A-1 and 3A-2. Next, the process 500 moves to operation 506, where the brushes 204 are removed from contact with the wafer surface 210. The wafer 200 is preferably held between a set of rollers 202 as the wafer 200 rotates, as discussed above with reference to FIGS. 3B-3 and 3B-4. After operation 506, the process 500 proceeds to operation 508, where a flow of cleaning fluid is delivered to the wafer surface 210 by way of a nozzle system. The benefits of this cleaning fluid delivery were discussed above.

Next, the process 500 moves to operation 510, where the wafer 200 is transported to a spin, rinse and dry (SRD) station 104. Alternatively, instead of moving to operation 510, the process 500 may move to a second brush box, where any combination of operations 504, 506 and 508 may be performed. After operation 510 or after the second brush box, the process 500 may proceed to operation 512, where fabrication operations following the foregoing cleaning operations may be performed on the wafer 200.

The process 500 then proceeds to a decision operation 514, where it is determined whether a next wafer is to be cleaned. If there is no next wafer to be cleaned, the process 500 is done. On the other hand, if a next wafer is desired to be cleaned, the process 500 goes back to operation 502 where another semiconductor wafer is loaded into the brush box. The foregoing cycle continues preferably until there is no next wafer at decision operation 514.

Specific reference has been made to wafer cleaning systems that implement a through the brush (TTB) technique. However, the cleaning methods of the present invention can be applied to other types of cleaning systems, such as those that implement a chemical drip applicator. Thus, by implementing these wafer cleaning methods, the overall cleaning system will generate a higher quality cleaned wafers.

While this invention has been described in terms of several preferred embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A system for cleaning a semiconductor wafer, comprising: a brush box, the brush box including,
    a top brush for scrubbing a top surface of the semiconductor wafer, the top brush configured to move orthogonally to a top surface of the semiconductor wafer;
    a bottom brush for scrubbing a bottom surface of the semiconductor wafer, the bottom brush extending over the diameter of the semiconductor wafer;
    at least one roller, the at least one roller capable of balancing the semiconductor wafer as it rests on the bottom brush;
    at least one top nozzle for applying a flow of water for rinsing the top surface of the semiconductor wafer, the top brush being removed from the top surface of the semiconductor wafer during the rinsing; and
    control means for spraying a fluid through the at least one top nozzle when the bottom brush is in an operative condition.

2. A system for cleaning a semiconductor wafer as recited in claim 1, wherein the top brush and the bottom brush used for scrubbing the top surface and the bottom surface of the semiconductor wafer implement a chemical cleaning solution, and the flow of water applied by the at least one top nozzle is configured to substantially remove the chemical cleaning solution.

3. A system for cleaning a semiconductor wafer as recited in claim 1, further comprising:
    at least one bottom nozzle for applying the flow of water to the bottom surface of the semiconductor wafer, the bottom brush being removed from the bottom surface of the semiconductor wafer during the rinsing.

4. A system for cleaning a semiconductor wafer as recited in claim 1, wherein the at least one top nozzle is arranged at an angle relative to the top surface of the semiconductor wafer and spaced apart at a raised distance from the top surface.

5. A system for cleaning a semiconductor wafer as recited in claim 4, wherein the angle ranges between about 10 degrees and about 35 degrees.

6. A system for cleaning a semiconductor wafer as recited in claim 4, wherein the raised distance is between about 2 mm and about 15 mm.

7. A system for cleaning a semiconductor wafer as recited in claim 4, wherein the at least one top nozzle overlies an edge of the top surface of the semiconductor wafer an overlying distance that is between about 3 mm and about 20 mm.

8. A system for cleaning a semiconductor wafer as recited in claim 1, wherein the wafer is configured to rotate at about 20 rotations per minute or less.

9. An apparatus for cleaning a semiconductor wafer, comprising:
    a brush box, the brush box including,
    a top brush for scrubbing a top surface of the semiconductor wafer, the top brush configured to move orthogonally to a top surface of the semiconductor wafer;
    a bottom brush for scrubbing a bottom surface of the semiconductor wafer, the bottom brush configured to move orthogonally to a bottom surface of the semiconductor wafer;
    a set of rollers configured to hold and rotate the semiconductor wafer when the top and bottom brushes are removed from the top and bottom surfaces of the wafer;
    at least one top nozzle for applying a flow of water for rinsing the top surface of the semiconductor wafer, the top brush being removed from the top surface of the semiconductor wafer during the rinsing; and
    control means for spraying a fluid through the at least one top nozzle when at least one of the top brush and the bottom brush is removed from the top and bottom surfaces of the wafer.

10. An apparatus for cleaning a semiconductor wafer as recited in claim 9, wherein the top brush and the bottom brush used for scrubbing the top surface and the bottom surface of the semiconductor wafer implements a chemical cleaning solution, and the flow of water applied by the at least one top nozzle is configured to substantially remove the chemical cleaning solution.

11. An apparatus for cleaning a semiconductor wafer as recited in claim 9, further comprising:
    at least one bottom nozzle for applying the flow of water to the bottom surface of the semiconductor wafer, the bottom brush being removed from the bottom surface of the semiconductor wafer while applying the flow of water to the bottom surface of the semiconductor wafer.

12. An apparatus for cleaning a semiconductor wafer as recited in claim 9, wherein the at least one top nozzle is arranged at an angle relative to the top surface of the semiconductor wafer and spaced apart from the top surface.

* * * * *